(12) United States Patent
Hourne et al.

(10) Patent No.: US 8,970,288 B2
(45) Date of Patent: Mar. 3, 2015

(54) DEVICE, SENSOR AND METHOD FOR DETECTING THE PRESENCE OF A USER FOR THE OPENING OF AN ACCESS POINT TO A MOTOR VEHICLE

(71) Applicants: Xavier Hourne, Cugnaux (FR); Monirat Ung, Seysses (FR); Julien Galaup, Toulouse (FR)

(72) Inventors: Xavier Hourne, Cugnaux (FR); Monirat Ung, Seysses (FR); Julien Galaup, Toulouse (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 14/285,790

(22) Filed: May 23, 2014

(65) Prior Publication Data
US 2014/0361826 A1 Dec. 11, 2014

(30) Foreign Application Priority Data
Jun. 7, 2013 (FR) ..................... 13 55280

(51) Int. Cl.
*H03K 17/96* (2006.01)
*H03K 17/955* (2006.01)

(52) U.S. Cl.
CPC .................... *H03K 17/955* (2013.01)
USPC ......................................... 327/517

(58) Field of Classification Search
USPC ................................ 327/516, 517
See application file for complete search history.

(56) References Cited

U.S. PATENT DOCUMENTS 8,704,586 B2 * 4/2014 Ho et al. ................... 327/517
2011/0210753 A1 9/2011 Hourne
2013/0194069 A1 8/2013 Baudru et al.

FOREIGN PATENT DOCUMENTS

WO 2010/051939 A1 5/2010
WO 2012/031654 A1 3/2012

OTHER PUBLICATIONS

French Search Report, dated Feb. 21, 2014, from corresponding PCT application.

* cited by examiner

*Primary Examiner* — Hai L Nguyen
(74) *Attorney, Agent, or Firm* — Young & Thompson

(57) ABSTRACT

A device for detecting the presence of a user for the unlocking of an access point to a motor vehicle, includes a first generator of a first supply voltage, a detection capacitor adapted to be charged on account of the presence of a user, and a storage capacitor defining at the terminals thereof a storage voltage. The device also includes an intermediate capacitor, elements for charging the detection capacitor from the first supply voltage and the storage voltage, elements for discharging the detection capacitor into the intermediate capacitor, elements for charging the storage capacitor, the elements being configured so that the charge of the storage capacitor is equal to the charge of the intermediate capacitor, and elements for detecting the presence of a user for the unlocking of an access point to the motor vehicle on the basis of the charge of the storage capacitor.

16 Claims, 2 Drawing Sheets

… (1)

DEVICE, SENSOR AND METHOD FOR DETECTING THE PRESENCE OF A USER FOR THE OPENING OF AN ACCESS POINT TO A MOTOR VEHICLE

FIELD OF THE INVENTION

The present invention relates to the automotive field, and more particularly to the field of the unlocking of an access point to a motor vehicle.

The invention relates to a device, a sensor and a method for detecting the presence of a user for the unlocking of an access point to a motor vehicle, and also to a motor vehicle comprising such a sensor.

BACKGROUND OF THE INVENTION

In a motor vehicle, it is known to use an access point unlocking system comprising a sensor for detecting the presence of a user, equipped with an authentication card. For example, such a sensor can thus detect the presence of a hand of the user on the handle of a door so as to unlock the door, or can detect the passing of a foot of the user in front of a sensor arranged beneath the luggage compartment of the vehicle so as to unlock the luggage compartment and open it at least in part.

To do this, the sensor is connected to an electronic control unit (ECU) of the vehicle, to which it sends a presence detection signal enabling it, for example after authentication, to unlock the corresponding access point.

Such a detection sensor is present in the form of a capacitive proximity sensor adapted to detect the presence, for example, of a hand or a foot of a user. Thus, for example, as illustrated in FIG. 1, the user can bring his hand M toward a sensor 3, arranged in a handle 6 of a door of the vehicle, during a movement between a first position 1 distanced from the sensor 3 and a second position 2 in the proximity of the sensor 3 in order to unlock the door. Thus, if a user brings his hand toward a vehicle door, the sensor arranged in the handle of said door makes it possible to detect a presence on account of the modification of the charge of the proximity sensor.

The detection sensor 3 is provided in the form of an electric circuit comprising a detection electrode 4 comprising a detection capacitor Cx connected to a printed circuit 5 comprising a "storage" capacitor Cs. In such a sensor 3, the user, whilst in the proximity of the electrode 4 of the sensor 3, behaves as a second electrode connected to ground, which increases the charge of the detection capacitor Cx. Such an increase is then evaluated via the storage capacitor Cs, as described hereinafter, so as to detect the presence of the user in order to allow the unlocking of the corresponding access point.

A known detection sensor is provided in the form of an electric circuit A, illustrated in FIG. 2, comprising a voltage generator Vcc, an electrode, represented by a detection capacitor Cx, a storage capacitor Cs, a resistor Rc and three bi-position switches S1, S2 and S3. The first switch S1 is arranged between the positive terminal of the voltage generator Vcc and a terminal of the detection capacitor Cx. The second switch S2 is arranged between the same terminal of the detection capacitor Cx and a terminal of the storage capacitor Cs, the other terminal respectively of each of the detection Cx and storage Cs capacitors, as well as the negative terminal of the voltage generator Vcc, being connected to a ground G. The third switch S3 is arranged between the positive terminal of the voltage generator Vcc and a terminal of the resistor Rc, of which the other terminal is connected to the terminal of the storage capacitor Cs, which is in turn connected to the switch S2. In order to detect the presence of a user, the sensor functions alternately in a first "acquisition" phase and a second "measurement" phase.

The acquisition phase comprises a cycle repeated a predetermined number (x) of times so as to charge the storage capacitor Cs at least with a reference charge Cref corresponding to a reference storage voltage Vsref at the terminals of the storage capacitor Cs. Such a sensor is said to be a "low-consumption linear charge-transfer" sensor.

A cycle of the acquisition phase comprises four steps enabling a linear charge transfer between the voltage generator Vcc and the storage capacitor Cs via the detection capacitor Cx. In the initial state of the circuit, the three switches S1, S2 and S3 are open. The third switch S3 remains open during the four steps of the acquisition phase. In a first step C referred to as a "charge" step, the first switch S1 is closed and the second switch S2 is open, which allows the detection capacitor Cx to be charged C by the voltage generator Vcc. In a second step referred to as a "rest" step, as illustrated in FIG. 2, the first switch S1 and the second switch S2 are open simultaneously. In a third step D referred to as a "discharge" step, the first switch S1 is open and the second switch S2 is closed, which allows the detection capacitor Cx to be discharged D into the storage capacitor Cs, that is to say allows induction charging of the storage capacitor Cs via the detection capacitor Cx. Lastly, in a fourth rest step, the first switch S1 and the second switch S2 are again opened simultaneously, as illustrated in FIG. 2.

When the storage capacitor Cs has been charged for a predetermined number x of cycles without a user having come into the proximity of the sensor, that is to say without the detection capacitor Cx having also been charged by the presence of a user in the proximity of the electrode 4 of the sensor 3, the charge of the storage capacitor Cs at the end of the acquisition phase corresponds to the reference charge Cref. In other words, the storage voltage at the terminals of the storage capacitor Cs corresponds to the reference storage voltage Vsref at the end of the acquisition phase.

By contrast, when the presence of a user has allowed the charging of the detection capacitor Cx, the charge of the storage capacitor Cs at the end of the acquisition phase corresponds to the reference charge Cref plus a detection charge Cdet of the user. In this case, the storage voltage Vs at the end of the acquisition phase is greater than the reference storage voltage Vsref.

During the measurement phase, in which the first switch S1 and the second switch S2 are open, the third switch S3 is closed so as to charge the storage capacitor Cs (reference M in FIG. 2), thanks to the charge current Ic passing through the resistor Rc, until the storage voltage Vs reaches a threshold voltage VTH, and the period of time between the moment of closure of the third switch S3 and the moment at which the storage voltage Vs reaches said threshold voltage VTH is then measured.

With the absence of the user in the proximity of the sensor during the acquisition phase, the period of time measured between the moment of closure of the third switch S3 (at which the storage voltage Vs is equal to the reference voltage Vsref) and the moment at which the storage voltage Vs reaches the threshold voltage VTH corresponds to a reference period Tref. In other words, in the absence of detection, the storage voltage Vs reaches the threshold voltage VTH after a reference period Tref. With the presence of a user in the proximity of the sensor 3 during the acquisition phase, the period of time measured between the moment of closure of the third switch S3 (at which the storage voltage Vs is equal to a detection voltage Vdet greater than the reference voltage Vsref) and the moment at which the storage voltage Vs reaches the threshold voltage VTH corresponds to a detection period Tdet, which is shorter than the reference period Tref, which indicates the detection of the presence of a user in the proximity of the electrode 4 of the sensor 3. In other words, during the detection of the presence of a user, the storage voltage Vs reaches the threshold voltage VTH more quickly during the measurement phase, and the detection period Tdet is thus shorter than the reference period Tref. By measuring the detection period Tdet, the presence of a user close to the sensor 3 is thus determined.

If the length of the electrode 4 comprising the detection capacitor Cx is significant, as may be the case with certain types of sensors 3, for example for the opening of a luggage compartment of a motor vehicle, the emissions radiated by the electrode 4 are significantly more substantial than those radiated by a shorter electrode 4, used, for example, in a motor vehicle door handle. Such radiated emissions may cause electromagnetic disturbances over certain electronic systems installed in the vehicle, which presents a disadvantage.

An immediate solution for reducing the level of radiated emissions lies in significantly reducing, in the electric circuit A, the voltage Vcc that generates the emissions radiated along the electrode 4.

A low value of the voltage Vcc, for example divided by ten, makes it possible, however, to charge the storage capacitor Cs by the value of Vcc in a single cycle, but leads to a significant decrease of the sensitivity of the sensor 3, unfortunately affecting the reliability thereof.

In addition, a low value of voltage Vcc limits the charge of the storage capacitor Cs, which may thus be substantially equal to the residual noise contained in the storage capacitor Cs. As a result, the measured detection period Tdet is substantially equal to the reference period, which does not allow reliable detection of the presence of a user and again constitutes a disadvantage.

SUMMARY OF THE INVENTION

The object of the present invention is to overcome these disadvantages by proposing a presence detection device of which the level of radiated emissions is significantly lower than that of the known prior art solution, whilst maintaining a sensitivity at least of the same order. Such a device is particularly adapted for the opening of an access point requiring a detection electrode of significant length, for example such as a motor vehicle luggage compartment.

The invention thus relates to a device for detecting the presence of a user for the unlocking of an access point to a motor vehicle, said device comprising a first generator of a first supply voltage, a detection capacitor adapted to be charged on account of the presence of a user, and a storage capacitor defining at the terminals thereof a storage voltage, the device being notable in that it comprises:
  an intermediate capacitor,
  means for charging the detection capacitor from the first supply voltage and the storage voltage,
  means for discharging the detection capacitor into the intermediate capacitor,
  first means for charging the storage capacitor, said means being configured so that the charge of the storage capacitor is equal to the charge of the intermediate capacitor,
  means for detecting the presence of a user for the unlocking of an access point to the motor vehicle on the basis of the charge of the storage capacitor.

With the device according to the invention, the detection capacitor is charged at the value of the first supply voltage (referenced by Vx hereinafter), which is significantly lower than the value of the supply voltage of the prior art (referenced by Vcc hereinbefore), which makes it possible to significantly reduce the radiated emissions. At the same time, the storage voltage, at the terminals of the storage capacitor, is reinjected at the terminals of the detection capacitor in such a way that the voltage at the terminals of the detection capacitor is equal to the sum of the first supply voltage and the storage voltage so as to enable the discharge of the detection capacitor into the intermediate capacitor at a voltage value equal to the value of the storage voltage (referenced by Vs hereinafter). Thus, from the viewpoint of the radiated emissions, the voltage at the terminals of the detection capacitor varies in accordance with the first supply voltage, which is lower than the supply voltage of the prior art, and the voltage at the terminals of the storage capacitor can thus exceed the low voltage of the first supply voltage due to the reinjection of the storage voltage at the terminals of the detection capacitor.

The means for charging the detection capacitor preferably comprise means for summing the first supply voltage and the storage voltage.

Even more preferably, the value of the intermediate capacitor is much lower than the value of the storage capacitor, which makes it possible to obtain a storage voltage equivalent to that of the prior art with the same number of cycles, given that the charge transmitted with each cycle of the acquisition phase is much lower than that of the prior art.

In accordance with an aspect of the invention, the means for charging the detection capacitor comprise a first switch, and the means for discharging the detection capacitor into the intermediate capacitor comprise a second switch.

The means for detecting preferably comprise:
  a second generator of a second supply voltage,
  second means for charging the storage capacitor from the second supply voltage,
  means for measuring the storage voltage,
  means for measuring a period of charging of the storage capacitor between an initial determined moment and a moment at which the storage voltage has reached a predetermined storage threshold, and
  means for comparing the measured period with a reference period so as to detect the presence of a user for the opening of an access point to the motor vehicle.

In accordance with an aspect of the invention, the charging means comprise a third switch arranged in series with a load resistor.

The period between the moment of closure of the switch and the moment at which the voltage at the terminals of the storage capacitor reaches the threshold voltage is preferably equal to:

$$t = -R_C \cdot C_S \cdot \ln\left(\frac{V_{CC} - V_{TH}}{V_{CC} - V_S(x)}\right)$$

where:
Rc is the load resistor,
Cs is the storage capacitor,
Vcc is the second supply voltage,
$V_{TH}$ is the threshold voltage, and
Vs(x) is the voltage at the terminals of the storage capacitor Cs after a number x of predetermined cycles in which the detection capacitor is discharged into the intermediate capacitor.

In accordance with a feature of the invention, the variation of the detection capacitor, which indicates the sensitivity of the device, is given by:

$$\Delta C_X = \frac{Th \cdot \Delta t}{R_C \cdot x} \cdot \frac{C_{INT}}{C_S} \cdot \frac{V_{CC}}{V_X}$$

where:
Th is the variation of a number of intervals Δt, given for example by a clock coupled to the device, included within the measured period in accordance with the variation of the detection capacitor,
$C_{INT}$ is the intermediate capacitor, and
Vx is the first supply voltage.

Advantageously, the values of $C_{INT}$, Cs, Vcc and Vx are selected such that $$\frac{C_{INT}}{C_S} \cdot \frac{V_{CC}}{V_X} \leq 1$$

(for example taking into account $$\frac{C_{INT}}{C_S} = \frac{V_x}{V_{CC}})$$

such that a sensitivity equal to or greater than that of the prior art is achieved. In fact, the lower is ΔCx, the greater is the sensitivity of the sensor.

The means for charging the storage capacitor preferably comprise a fourth switch and an operational amplifier, of which the output is connected to the negative input terminal, such that the charge of the storage capacitor is equal to the charge of the intermediate capacitor. In other words, the operational amplifier makes it possible to "copy" the charge of the intermediate capacitor into the storage capacitor.

The means for charging the storage capacitor advantageously comprise an intermediate resistor assembled in series at the output of the operational amplifier.

The invention also relates to a sensor for detecting the presence of a user for the unlocking of an access point to a motor vehicle, said sensor comprising a first generator of a first supply voltage, a detection capacitor adapted to be charged on account of the presence of a user, and a storage capacitor defining at the terminals thereof a storage voltage, the sensor being notable in that it comprises:
  an intermediate capacitor,
  means for charging the detection capacitor from the first supply voltage and the storage voltage,
  means for discharging the detection capacitor into the intermediate capacitor,
  first means for charging the storage capacitor, said means being configured so that the charge of the storage capacitor is equal to the charge of the intermediate capacitor.

The invention also relates to a motor vehicle comprising a device as presented above.

The device is preferably coupled to a system for authenticating a user, preferably comprising an RFID tag.

The invention also relates to a method for detecting the presence of a user for the unlocking of an access point to a motor vehicle, said method, implemented by a device comprising a first generator of a first supply voltage, a detection capacitor adapted to be charged on account of the presence of a user, an intermediate capacitor, and a storage capacitor defining at the terminals thereof a storage voltage, being notable in that it comprises:
  at least one step of charging the detection capacitor from the first supply voltage and the storage voltage,
  at least one step of discharging the detection capacitor into the intermediate capacitor,
  at least one step of charging the storage capacitor, such that the charge of the storage capacitor is equal to the charge of the intermediate capacitor,
  a step of detecting the presence of a user for the unlocking of an access point to the motor vehicle on the basis of the charge of the storage capacitor.

BRIEF DESCRIPTION OF THE DRAWINGS

Further features and advantages of the invention will become clear from the following description provided with reference to the accompanying figures, which are given by way of non-limiting example and in which identical references are attributed to like elements.

DETAILED DESCRIPTION OF THE INVENTION

The device according to the invention is intended to be installed in a motor vehicle to allow the unlocking of an access point to said vehicle, such as, for example, a luggage compartment or a door of the vehicle.

Figure 1:
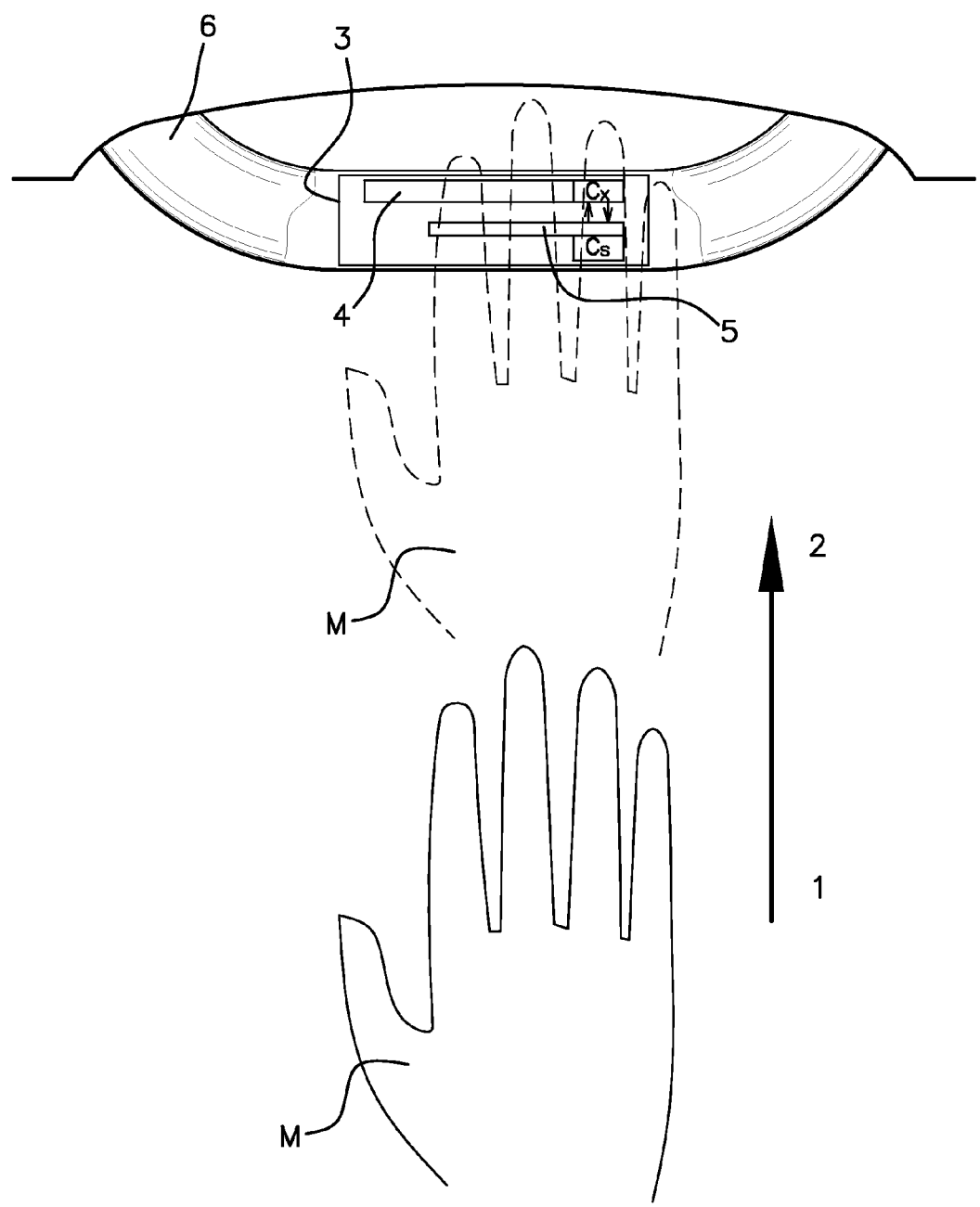
FIG. 1 illustrates a detection sensor of the prior art arranged in a motor vehicle door handle.
Figure 2:
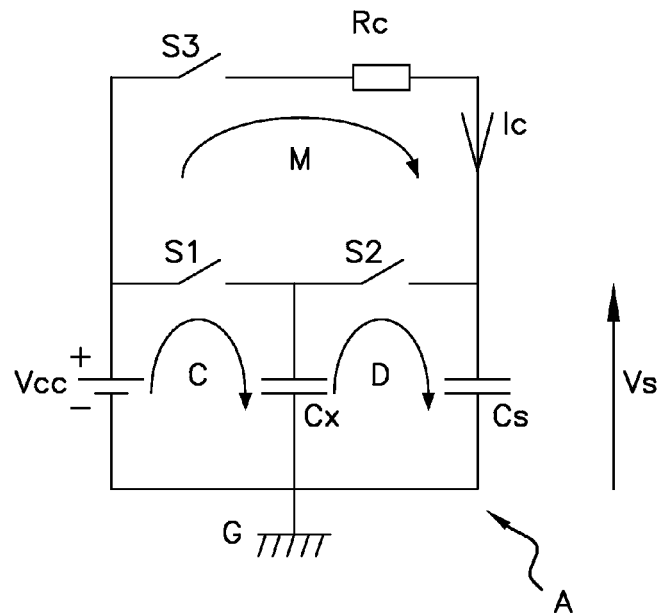
FIG. 2 schematically shows a linear charge-transfer detection device of the prior art.
Figure 3:
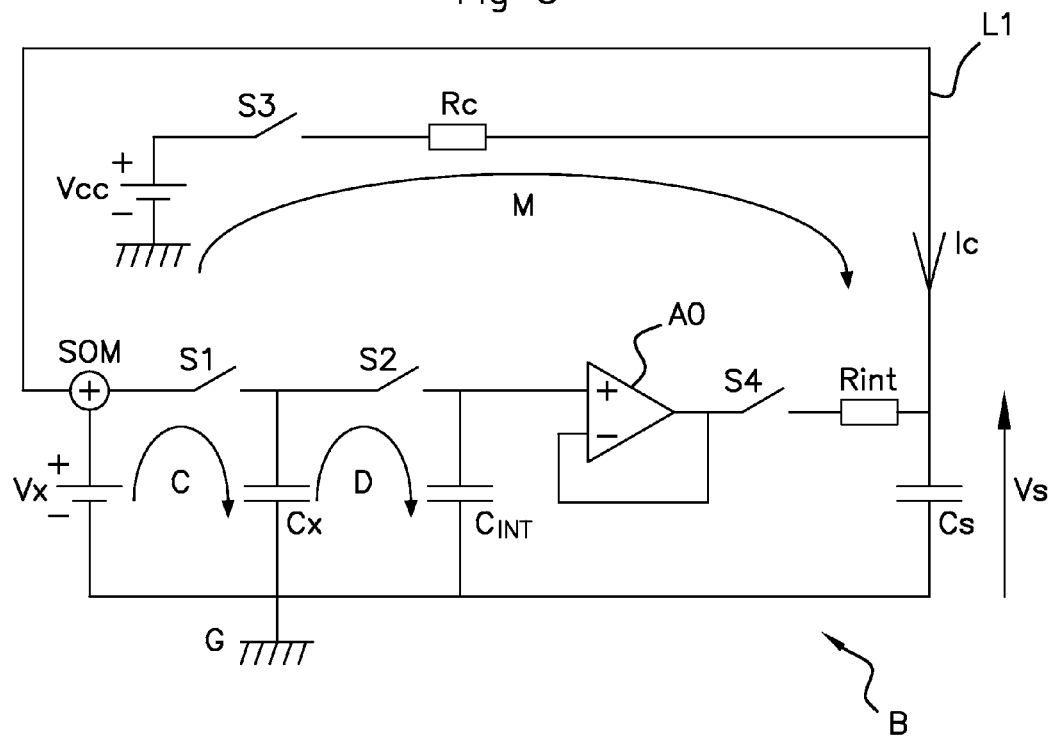
FIG. 3 schematically shows a linear charge-coupled detection device in accordance with an embodiment of the invention.

The embodiment of the device according to the invention described hereinafter with reference to FIG. 3 is provided in the form of a circuit B.

The device comprises a sensor and means for detecting the presence of a user for the unlocking of an access point to the motor vehicle.

It goes without saying that the different elements of the device can be regrouped over a single physical entity or provided by a number of separate physical entities. For example, the detection means may thus be provided on the one hand on a printed circuit and on the other hand on a control unit of the vehicle of the electronic control unit (ECU) type.

In order to perform a phase of acquisition, during which a storage capacitor Cs is charged during a fixed number x of cycles, the detection capacitor comprises a first generator of a first supply voltage Vx, a detection capacitor Cx, an intermediate capacitor $C_{INT}$, a storage capacitor Cs, means for charging the detection capacitor Cx from the first supply voltage Vx and the storage voltage Vs defined at the terminals of the storage capacitor Cs, means for discharging the detection capacitor Cx into the intermediate capacitor Cint, and first means for charging the storage capacitor Cs.

The detection sensor is a capacitive proximity sensor comprising an electrode for detecting the presence of a user, said electrode being represented in FIG. 3 by the detection capacitor Cx. Such an electrode can be formed for example by a coaxial cable.

In the example illustrated in FIG. 3, the means for charging the detection capacitor Cx are provided in the form of a first bi-position switch S1, the opening and closing of which is controlled by a control module (not shown) known to a person skilled in the art, of a link L1 making it possible to electrically connect a first terminal of the storage capacitor Cs and the positive terminal of the first generator of the first supply voltage Vx, and of a summing module SOM, known to a person skilled in the art, for summing the first supply voltage Vx and the storage voltage Vs. The negative terminal of the first generator of the first voltage Vx is connected to a ground G, as is the second terminal of the storage capacitor Cs.

In this example, the means for discharging the detection capacitor Cx into the intermediate capacitor $C_{INT}$ are provided in the form of a second bi-position switch S2, of which the opening and closing are controlled by a control module (not shown) known to a person skilled in the art.

The detection capacitor Cx is connected by a first terminal to the first switch S1 and to the second switch S2 and by a second terminal to ground G. the intermediate capacitor $C_{INT}$ is connected by a first terminal to the second switch S2 and by its second terminal to ground G.

Still with reference to FIG. 3, the first means for charging the storage capacitor Cs are configured such that the charge of the storage capacitor (Cs) is equal to the charge of the intermediate capacitor $C_{INT}$.

In this example, the first means for charging the storage capacitor Cs are provided in the form of an operational amplifier AO, a fourth bi-position switch S4, and an intermediate resistor Rint assembled in series with said operational amplifier AO.

The first terminal of the intermediate capacitor $C_{INT}$ is connected to the positive input terminal of the operational amplifier AO, and the output of the operational amplifier AO is connected at its negative input terminal so as to allow the charging of the storage capacitor Cs to the level of the charge of the intermediate capacitor $C_{INT}$. In other words, the operational amplifier AO makes it possible to "copy" the charge of the intermediate capacitor $C_{INT}$ into the storage capacitor Cs.

The opening and closing of the fourth switch S4 are controlled by a control module (not shown) known to a person skilled in the art so as to allow the charging of the storage capacitor Cs to the level of the charge of the intermediate capacitor $C_{INT}$ via the operational amplifier AO and the resistor Rint.

The purpose of the resistor Rint is to generate a charge current from the second supply voltage Vcc.

The use of an intermediate capacitor $C_{INT}$ allows the complete discharge of the detection capacitor Cx. In fact, if the detection capacitor Cx were discharged directly into the storage capacitor Cs, the value thereof would be low, for example approximately 3 nF if Cx is approximately 30 pF, so as to allow a complete discharge, however it would no longer be sufficient to allow the storage of a reference charge and of a detection charge, and the detection therefore could not be performed.

The value of the intermediate capacitor $C_{INT}$ is therefore preferably selected so as to ensure that the detection capacitor Cx discharges entirely into the intermediate capacitor $C_{INT}$. For example, the value of $C_{INT}$ may be approximately one hundred times greater than the value of Cx and ten times smaller than the value of Cs.

The means for detecting the presence of a user for the unlocking of an access point to the motor vehicle on the basis of the charge of the storage capacitor Cs comprise second means for charging the storage capacitor Cs, means for measuring the storage voltage Vs, means for measuring a period of time, and means for comparing the measured period with a reference period.

Still with reference to FIG. 3, the second means for charging the storage capacitor Cs comprise a second generator configured to generate a second supply voltage Vcc, a third bi-position switch S3, of which the opening and closing are controlled by a control module (not shown) known to a person skilled in the art, arranged in series with a load resistor Rc.

If the third switch S3 is in the closed position, a charge current Ic generated by the second generator of the second supply voltage Vcc through the resistor Rc allows the charging of the storage capacitor Cs.

The means (not shown) for measuring the storage voltage Vs of the device make it possible to measure the storage voltage Vs at the terminals of the storage capacitor Cs and to determine that the storage voltage Vs reaches a predetermined voltage threshold $V_{TH}$ when the charge current Ic, generated by the second generator of the second supply voltage Vcc through the resistor Rc, charges the storage capacitor Cs.

The means (not shown) for measuring a period of time make it possible to measure the period t of charging, by the current Ic, of the storage capacitor Cs between an initial determined moment, corresponding in this example to the moment of closure of the third switch S3, and the moment at which the storage voltage Vs reaches the threshold voltage $V_{TH}$.

Lastly, the comparison means (not shown) make it possible to compare the period t measured by the measurement means with a reference period Tref so as to detect the presence of a user for the unlocking of an access point to the motor vehicle.

To this end, the comparison means may, for example, send a detection signal to a control unit, for example of the ECU type, such that this controls the unlocking of the access point.

So as to detect the presence of a user, the device functions alternately in a first "acquisition" phase and a second "measurement" phase.

The acquisition phase comprises a predetermined number x of cycles. Each cycle comprises four steps enabling a linear charge transfer between the first generator of the first voltage Vx and the storage capacitor Cs via the detection capacitor Cx and the intermediate capacitor $C_{INT}$.

At the start of a cycle, the first switch S1, the second switch S2 and the third switch S3 are open. The third switch S3 remains open for the entire duration of the acquisition phase, whereas the fourth switch S4 remains closed for the entire duration of the acquisition phase.

During the first step of a cycle, the first switch S1 is closed and the second switch S2 is open, which allows the charging (referenced by C in FIG. 3) of the detection capacitor Cx by the first generator of the first voltage Vx.

During a second "rest" step, the first switch S1 and the second switch S2 are open simultaneously.

During the third step, the first switch S1 is open and the second switch S2 is closed, which allows the charging of the intermediate capacitor $C_{INT}$ by the detection capacitor Cx, or, in other words, the discharging of the detection capacitor Cx into the intermediate capacitor $C_{INT}$ (referenced by D in FIG. 3).

Lastly, during a fourth "rest" step, the first switch S1 and the second switch S2 are opened again simultaneously.

From one cycle i to the following cycle i+1, the storage voltage Vs at the terminals of the storage capacitor Cs varies in accordance with the following formula:

$$V_S(i+1) = \frac{V_S(i) \cdot C_{INT} + C_X \cdot (V_X + V_s(i))}{C_{INT} + C_X} \quad (1)$$

By selecting a value of the intermediate capacitor $C_{INT}$ much greater than the value of the detection capacitor Cx, the voltage Vs thus varies in accordance with the following formula:

$$V_S(i+1) = V_S(i) + \frac{C_X \cdot V_X}{C_{INT}} \quad (2)$$

With:

$$\frac{V_S(i+1)}{V_S(i)} = \frac{i+1}{i},$$

the following is obtained:

$$V_S(i) = i \cdot \frac{C_X}{C_{INT}} \cdot V_X \quad (3)$$

The cycle is repeated a predetermined number x of times so as to charge the storage capacitor Cs with a reference charge Cref, and the storage voltage Vs at the terminals of the storage capacitor Cs is thus given by the following formula:

$$V_S(x) = x \cdot \frac{C_X}{C_{INT}} \cdot V_X$$

During the measurement phase, in which the first switch S1, the second switch S2 and the fourth switch S4 are open, the third switch S3 is closed so as to charge (referenced by M in FIG. 3) the storage capacitor Cs thanks to the charge current Ic generated by the second generator of the second supply voltage Vcc through the resistor Rc.

During the measurement phase, the means for measuring the storage voltage Vs of the device measure the storage voltage Vs and determine the moment at which the storage voltage Vs reaches a threshold voltage $V_{TH}$.

At the same time, the means for measuring a period of time measure the period t of charging from the moment of closure of the third switch S3, that is to say the start of the measurement phase, and the moment at which the storage voltage Vs has reached the threshold voltage VTH.

This measured period t is given by the following formula:

$$V_{TH} = V_S(x) + (V_{CC} - V_S(x)) \cdot \left(1 - e^{-\frac{t}{R_c \cdot C_S}}\right) \quad (4)$$

$$V_{TH} = V_{CC} - C_{CC} \cdot e^{-\frac{t}{R_c \cdot C_S}} + V_S(x) \cdot e^{-\frac{t}{R_c \cdot C_S}} \quad (5)$$

$$\frac{V_{CC} - V_{TH}}{V_{CC} - V_S(x)} = e^{-\frac{t}{R_c \cdot C_S}} \quad (6)$$

that is to say:

$$t = -R_c \cdot C_s \cdot \ln\left(\frac{V_{CC} - V_{TH}}{V_{CC} - V_s(x)}\right) \quad (7)$$

The period t is measured with a time base $\Delta t$, which is the accuracy of time measurement of a clock (not shown) coupled to the detection sensor. The term "coupled" means that the clock may be internal or external to the sensor. The time base $\Delta t$ (or temporal resolution) is thus fixed by the clock.

The letter y is appointed as the number of $\Delta t$ accuracy intervals included within the period t, that is to say $y=t/\Delta t$, and the following is obtained:

$$y \cdot \Delta t = -R_c \cdot C_s \cdot \ln\left(\frac{V_{CC} - V_{TH}}{V_{CC} - V_s(x)}\right) \quad (8)$$

$$y \cdot \Delta t = -R_C \cdot C_S \cdot \ln\left(\frac{V_{CC} - V_{TH}}{V_{CC} - x \cdot \frac{C_X}{C_{INT}} \cdot V_x}\right) \quad (9)$$

$$y = -\frac{R_C \cdot C_S}{\Delta t} \cdot \left(\ln(V_{CC} - V_{TH}) - \ln\left(V_{CC} - x \cdot \frac{C_X}{C_{INT}} \cdot V_X\right)\right) \quad (10)$$

$$y = -\frac{R_C \cdot C_S}{\Delta t} \cdot \left(\ln(V_{CC} - V_{TH}) - \ln\left(1 - x \cdot \frac{C_X}{V_{CC} \cdot C_{INT}} \cdot V_X\right)\right) \quad (11)$$

As $$x \cdot \frac{C_X}{V_{CC} \cdot C_{INT}} V_X \to 0$$

when $x \to 0$ a first-order Taylor expansion of ln(1−x) into −x is provided, that is to say:

$$y = -\frac{R_C \cdot C_S}{\Delta t} \cdot \left(\ln(V_{CC} - V_{TH}) + x \cdot \frac{C_X}{C_{INT}} \cdot \frac{V_X}{V_{CC}}\right) \quad (12)$$

The variation of the variable y in accordance with the variation of capacitance $\Delta Cx$ generating a variation −Th (an increase of $\Delta Cx$ generates a decrease of Th) is given by:

$$\frac{\partial y}{\partial Cx} = -Th = \frac{R_C \cdot C_S}{\Delta t} \cdot \left(x \cdot \frac{\Delta C_X}{C_{INT}} \cdot \frac{V_X}{V_{CC}}\right) \quad (13)$$

that is to say:

$$\Delta C_X = \frac{Th \cdot \Delta t}{R_C \cdot x} \cdot \frac{C_{INT}}{C_S} \cdot \frac{V_{CC}}{V_X} \quad (14)$$

Thus, if $$\frac{C_{INT}}{C_S} = \frac{V_X}{V_{CC}},$$

the sensor 3 has a sensitivity identical to that of the prior art solution, whilst significantly limiting the radiated emissions.

The comparison means thus compare the period t measured by the measurement means with a reference period Tref so as to detect a presence of a user for the unlocking of an access point to the motor vehicle.

Thus, when the storage capacitor Cs is charged for a predetermined number x of cycles without any movement disturbing the sensor, that is to say without the detection capacitor Cx being charged by the presence of a user in the proximity of the sensor, the charge of the storage capacitor Cs at the end of the acquisition phase corresponds to a reference charge Cref. In this case, the period t measured by the measurement means between the moment of closure of the third switch S3 and the moment at which the voltage Vs reaches the threshold voltage $V_{TH}$ corresponds to the predetermined reference period Tref.

By contrast, when the presence of a user has charged the detection capacitor Cx during the acquisition phase, the charge of the storage capacitor Cs at the end of the acquisition phase corresponds to the reference charge Cref plus a detection charge Cdet corresponding to the charge of the detection capacitor Cx by the user. In other words, the storage voltage Vs is greater at the end of the acquisition phase if a user is located in the proximity of the sensor.

The period t measured between the moment of closure of the third switch S3 and the moment at which the voltage Vs reaches the threshold voltage $V_{TH}$ is thus, in this case, shorter than the reference period Tref, which indicates a detection of the proximity of the user so as to unlock the corresponding access point to the vehicle.

The value of the intermediate capacitor $C_{INT}$ is advantageously selected so as to ensure that the detection capacitor Cx discharges entirely into the intermediate capacitor $C_{INT}$.

Thus, for example, the following values can be used:
Vx=0.33 V,
detection capacitor Cx=30 pF,
intermediate capacitor $C_{INT}$=3 nF,
storage capacitor Cs=30 nF,
Vcc=3.3V,
Rc=200 kΩ,
x=255,
$V_{TH}$=1V,
Th=10,
Δt=1 μs.

The following values would be applicable with the prior art solution:
Vs(x)=0.743 V,
t=635 μs,
ΔCx=196 fF,
amplitude of the signal across the electrode=3.3 V,
level of radiated emissions: 80 dB.

The following values are applicable with the sensor according to the invention:
Vs(x)=0.841 V,
t=400 μs,
ΔCx=196 fF,
amplitude of the signal across the electrode Vx: 0.33 V,
level of radiated emissions: 60 dB.

The gain in emission, also given by the formula 20 log(Vcc (prior art)/Vx), is thus 20 log(3.3/0.33)=20 dB.

The present invention therefore makes it possible to considerably reduce the level of emissions radiated by the sensor without reducing the sensitivity. Such a decrease of the level of radiated emissions makes it possible advantageously to avoid electromagnetic disturbances over other electronic systems installed in the vehicle. The sensor according to the invention can also maintain a sensitivity at least equal to that of the prior art solution, which makes it possible to reliably detect the presence of a user.

The invention claimed is:

1. Device for detecting the presence of a user for the unlocking of an access point to a motor vehicle, said device comprising a first generator of a first supply voltage (Vx), a detection capacitor (Cx) adapted to be charged on account of the presence of a user, and a storage capacitor (Cs) defining at the terminals thereof a storage voltage (Vs), said device being characterized in that it comprises:
an intermediate capacitor ($C_{INT}$),
means for charging the detection capacitor (Cx) from the first supply voltage (Vx) and the storage voltage (Vs), comprising voltage summing means, such that the voltage at the terminals of the detection capacitor (Cx) is equal to the sum of the first supply voltage (Vx) and the storage voltage (Vs),
means for discharging the detection capacitor (Cx) into the intermediate capacitor ($C_{INT}$) so as to allow the discharge of the detection capacitor (Cx) into the intermediate capacitor ($C_{INT}$) at a voltage value equal to the storage voltage (Vs),
first means for charging the storage capacitor (Cs), said means being configured so that the charge of the storage capacitor (Cs) is equal to the charge of the intermediate capacitor ($C_{INT}$), and
means for detecting the presence of a user for the unlocking of an access point to the motor vehicle on the basis of the charge of the storage capacitor (Cs).

2. Device according to claim 1, characterized in that the means for charging the detection capacitor (Cx) comprise a first switch (S1), and the means for discharging the detection capacitor (Cx) into the intermediate capacitor ($C_{INT}$) comprise a second switch (S2).

3. Device according to claim 2, characterized in that the means for detecting comprise:
a second generator of a second supply voltage (Vcc),
second means for charging the storage capacitor (Cs) from the second supply voltage (Vcc),
means for measuring the storage voltage (Vs),
means for measuring a period (t) of charging of the storage capacitor (Cs) between an initial determined moment and a moment at which the storage voltage (Vs) has reached a predetermined storage threshold ($V_{TH}$), and,
means for comparing the measured period (t) with a reference period (Tref) so as to detect the presence of a user for the unlocking of an access point to the motor vehicle.

4. Device according to claim 2, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

5. Device according to claim 1, characterized in that the means for detecting comprise:

a second generator of a second supply voltage (Vcc),
second means for charging the storage capacitor (Cs) from the second supply voltage (Vcc),
means for measuring the storage voltage (Vs),
means for measuring a period (t) of charging of the storage capacitor (Cs) between an initial determined moment and a moment at which the storage voltage (Vs) has reached a predetermined storage threshold ($V_{TH}$), and,
means for comparing the measured period (t) with a reference period (Tref) so as to detect the presence of a user for the unlocking of an access point to the motor vehicle.

6. Device according to claim 5, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

7. Device according to claim 5, characterized in that the second charging means comprise a third switch (S3) arranged in series with a load resistor (Rc).

8. Device according to claim 7, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

9. Device according to claim 7, characterized in that the capacitance variation (ΔCx) of the detection capacitor (Cx) is given by:

$$\Delta C_X = \frac{Th \cdot \Delta t}{R_C \cdot x} \cdot \frac{C_{INT}}{C_S} \cdot \frac{V_{CC}}{V_X}$$

where Th is the variation of the number of intervals Δt included within the measured period (t) in accordance with the variation of the detection capacitor.

10. Device according to claim 9, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

11. Device according to claim 9, characterized in that $$\frac{C_{INT}}{C_S} \cdot \frac{V_{CC}}{V_X} \leq 1.$$

12. Device according to claim 11, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

13. Device according to claim 1, characterized in that the first means for charging the storage capacitor (Cs) comprise a fourth switch (S4) and an operational amplifier (AO), of which the output is connected to the negative input terminal, such that the charge of the storage capacitor (Cs) is equal to the charge of the intermediate capacitor ($C_{INT}$).

14. Motor vehicle characterized in that it comprises a device according to claim 1.

15. Sensor for detecting the presence of a user for the unlocking of an access point to a motor vehicle, said sensor comprising a first generator of a first supply voltage (Vx), a detection capacitor (Cx) adapted to be charged on account of the presence of a user, and a storage capacitor (Cs) defining at the terminals thereof a storage voltage, said sensor being characterized in that it comprises:
  an intermediate capacitor ($C_{INT}$),
  means for charging the detection capacitor (Cx) from the first supply voltage (Vx) and the storage voltage (Vs), comprising voltage summing means, such that the voltage at the terminals of the detection capacitor (Cx) is equal to the sum of the first supply voltage (Vx) and the storage voltage (Vs),
  means for discharging the detection capacitor (Cx) into the intermediate capacitor ($C_{INT}$) so as to allow the discharge of the detection capacitor (Cx) into the intermediate capacitor ($C_{INT}$) at a voltage value equal to the storage voltage (Vs),
  first means for charging the storage capacitor (Cs), said means being configured so that the charge of the storage capacitor (Cs) is equal to the charge of the intermediate capacitor ($C_{INT}$).

16. Method for detecting the presence of a user for the unlocking of an access point to a motor vehicle, said method, implemented by a device comprising a first generator of a first supply voltage (Vx), a detection capacitor (Cx) adapted to be charged on account of the presence of a user, an intermediate capacitor ($C_{INT}$), and a storage capacitor (Cs) defining at the terminals thereof a storage voltage (Vs), being characterized in that it comprises:
  at least one step of charging the detection capacitor (Cx) from the first supply voltage (Vx) and the storage voltage (Vs), such that the voltage at the terminals of the detection capacitor (Cx) is equal to the sum of the first supply voltage (Vx) and the storage voltage (Vs),
  at least one step of discharging the detection capacitor (Cx) into the intermediate capacitor ($C_{INT}$) so as to allow the discharge of the detection capacitor (Cx) into the intermediate capacitor ($C_{INT}$) at a voltage value equal to the storage voltage (Vs),
  at least one step of charging the storage capacitor (Cs), such that the charge of the storage capacitor (Cs) is equal to the charge of the intermediate capacitor ($C_{INT}$),
  a step of detecting the presence of a user for the unlocking of an access point to the motor vehicle on the basis of the charge of the storage capacitor (Cs).

* * * * *